United States Patent
Li et al.

(10) Patent No.: US 6,858,887 B1
(45) Date of Patent: Feb. 22, 2005

(54) BJT DEVICE CONFIGURATION AND FABRICATION METHOD WITH REDUCED EMITTER WIDTH

(75) Inventors: James Chingwei Li, San Diego, CA (US); Richard L. Pierson, Jr., Thousand Oaks, CA (US); Berinder P. S. Brar, Newbury Park, CA (US); John A. Higgins, Westlake Village, CA (US)

(73) Assignee: Innovative Technology Licensing LLC, Thousand Oaks, CA (US)

( * ) Notice: Subject to any disclaimer, the term of this patent is extended or adjusted under 35 U.S.C. 154(b) by 0 days.

(21) Appl. No.: 10/632,052

(22) Filed: Jul. 30, 2003

(51) Int. Cl.$^7$ .......................................... H01L 31/0328
(52) U.S. Cl. ...................... 257/197; 257/183; 257/142; 257/200; 257/201; 257/613; 257/615; 438/285; 438/540
(58) Field of Search ................................ 257/183, 192, 257/197, 200, 201, 613, 615; 438/285, 590

(56) References Cited

U.S. PATENT DOCUMENTS

| | | | | |
|---|---|---|---|---|
| 4,654,687 A | * | 3/1987 | Hebert | 257/584 |
| 5,136,349 A | * | 8/1992 | Yilmaz et al. | 257/339 |
| 5,729,033 A | * | 3/1998 | Hafizi | 257/198 |
| 5,907,165 A | * | 5/1999 | Hamm et al. | 257/197 |
| 6,399,971 B1 | * | 6/2002 | Shigematsu et al. | 257/197 |
| 6,482,711 B1 | * | 11/2002 | Nguyen et al. | 438/317 |

* cited by examiner

Primary Examiner—Allan R. Wilson
Assistant Examiner—Edgardo Oritz
(74) Attorney, Agent, or Firm—Koppel, Jacobs, Patrick & Heybl

(57) ABSTRACT

A BJT device configuration includes an emitter finger and via arrangement which reduces emitter finger width, and is particularly suitable for use with compound semiconductor-based devices. Each emitter finger includes a cross-shaped metal contact which provides an emitter contact; each contact comprises two perpendicular arms which intersect at a central area. A via through an interlevel dielectric layer provides access to the emitter contact; the via is square-shaped, centered over the center point of the central area, and oriented at a 45° angle to the arms. This allows the via size to be equal to or greater than the minimum process dimension, while allowing the width of the emitter finger to be as narrow as possible with the alignment tolerances still being met.

18 Claims, 11 Drawing Sheets

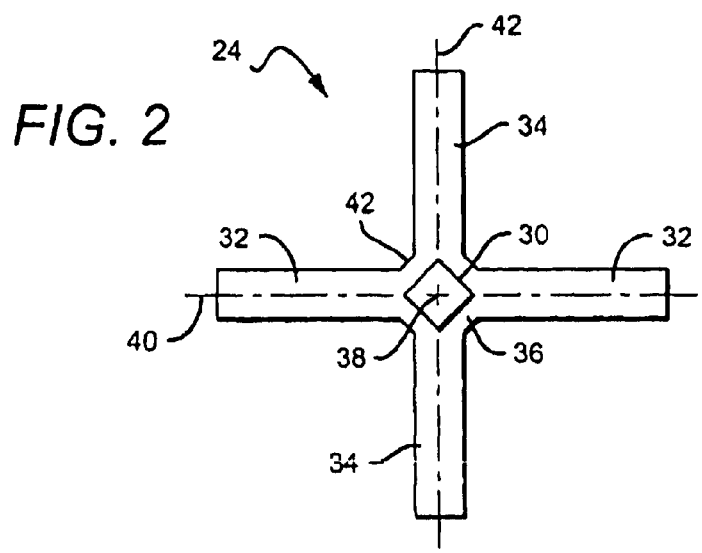
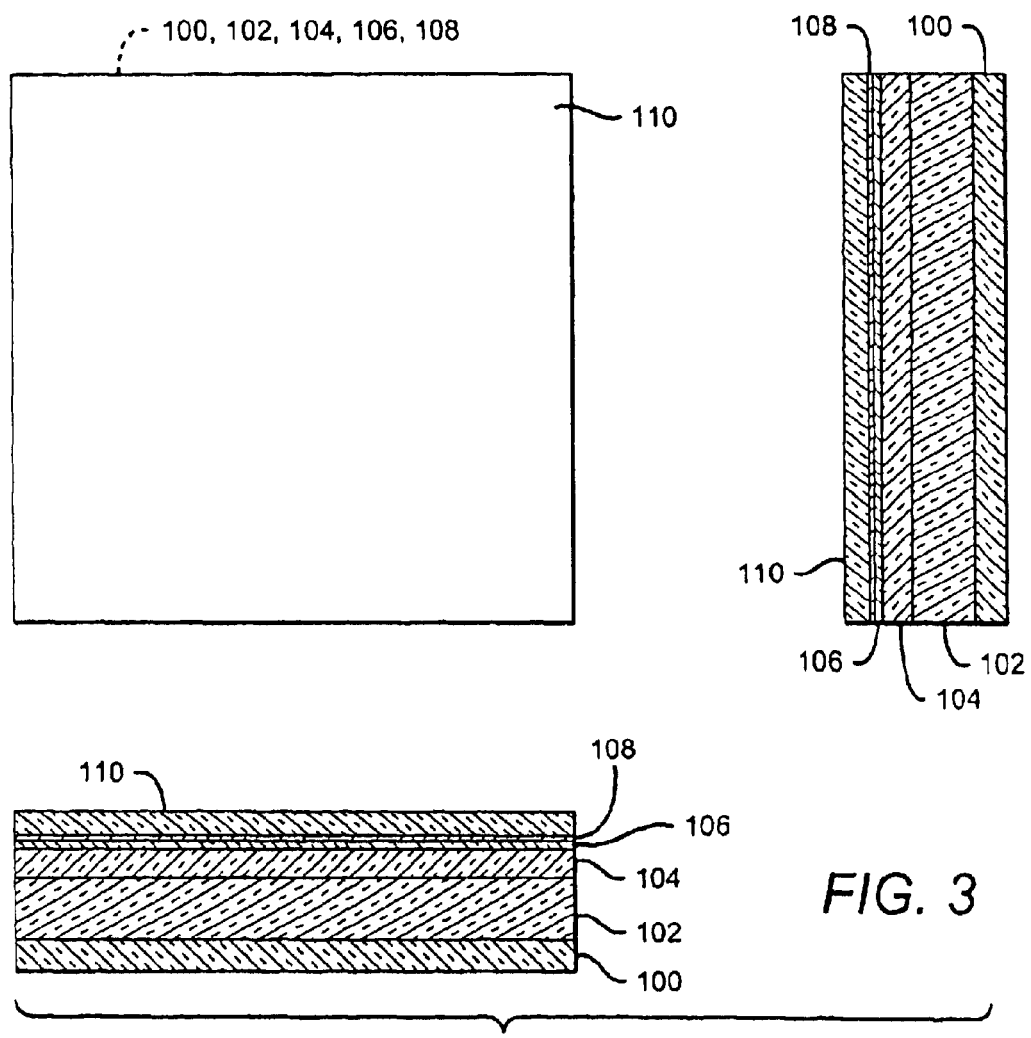

FIG. 10
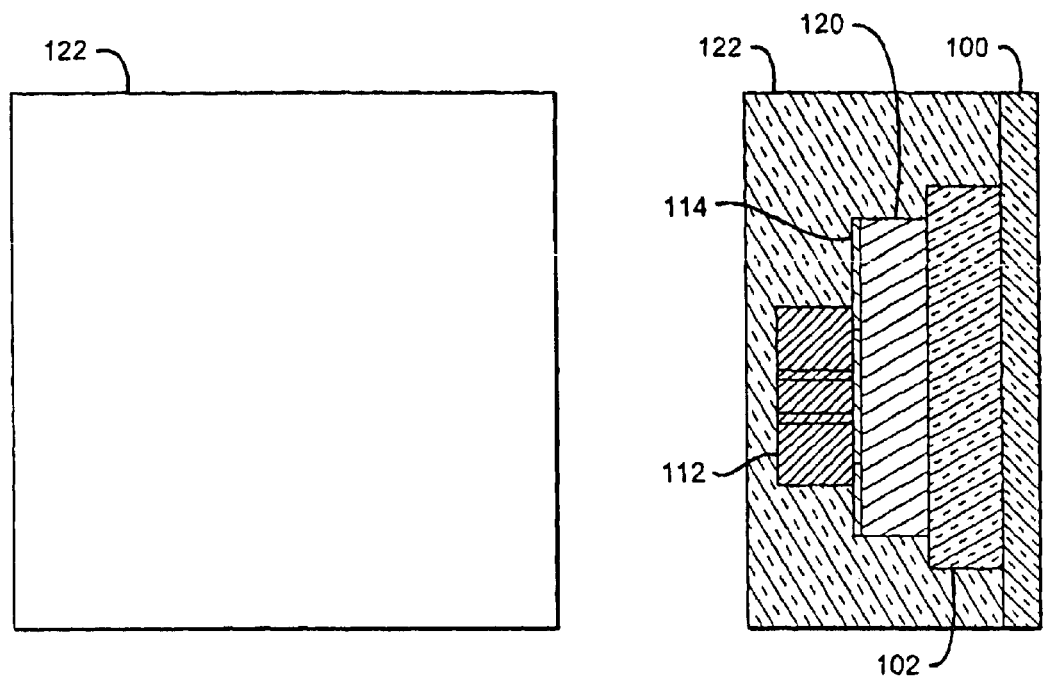
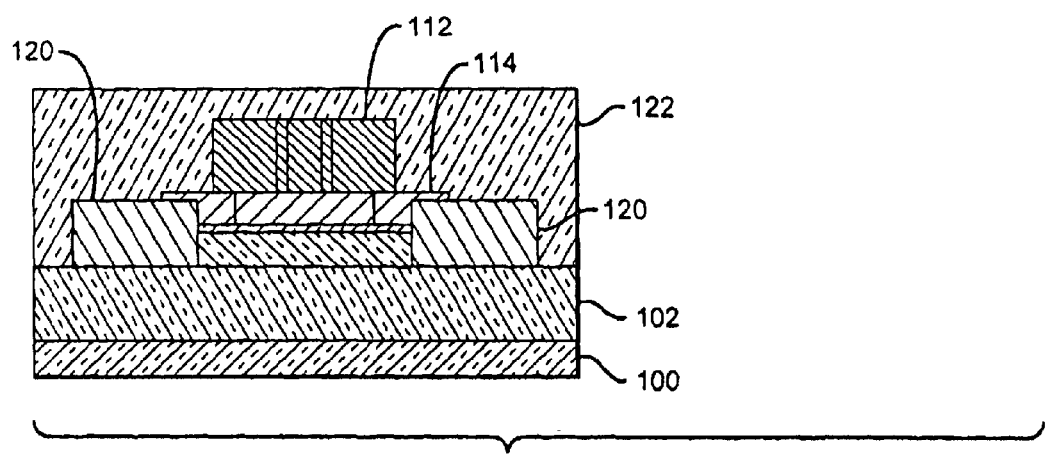

US 6,858,887 B1

BJT DEVICE CONFIGURATION AND FABRICATION METHOD WITH REDUCED EMITTER WIDTH

BACKGROUND OF THE INVENTION

1. Field of the Invention

This invention relates to the field of bipolar junction transistor (BJT) structures, and particularly to methods of reducing the width of a BJT or HBT device's emitter fingers.

2. Description of the Related Art

Power BJTs typically achieve a high current carrying capacity by dividing the device's emitter and emitter contact into a number of separate "fingers". For best performance, the width of each emitter finger is made as narrow as possible; this enables base resistance ($R_B$) and base-collector capacitance ($C_{BC}$) to be reduced, which improves the device's RF performance. Heat dissipation is also improved with narrow emitter fingers. Access to each emitter finger is provided with a via formed through an intervening inter-level dielectric layer.

The narrowness of an emitter finger is limited by the minimum dimension associated with the fabrication process used to fabricate the device, and by the process's minimum alignment tolerances. For example, if the minimum process dimension is 0.6 μm, then the minimum width of the vias to each finger is 0.6 μm. Then, if the fabrication process has an alignment tolerance of 0.3 μm, the minimum emitter width ($W_E$) is 1.2 μm (0.3 μm+1.2 μm+0.3 μm). This width may result in unacceptable RF and/or thermal performance for the resulting device.

One solution to this problem is found in the silicon semiconductor industry: a T-shaped emitter is fabricated from polycrystalline silicon; forming the via at the top of the T allows one of the alignment tolerances to be avoided, thereby enabling a narrower emitter width. However, for devices based on compound semiconductors such as indium phosphide (InP)—typically employed for operation at very high frequencies—this approach is not feasible. The high temperature processing required to fabricate the polycrystalline silicon emitter is incompatible with the processes needed to fabricate compound semiconductors, and no convenient analog to polysilicon exists in compound semiconductors.

SUMMARY OF THE INVENTION

A BJT device configuration and fabrication method are described which overcome the problems noted above. An emitter finger and via arrangement reduces emitter finger width, and is particularly suitable for use with compound semiconductor-based devices.

The present invention includes a semi-insulating substrate, on top of which are provided subcollector, collector, base, and emitter layers. Metal contacts on the subcollector and base layers provide collector and base contacts, respectively. The emitter is divided into separate emitter fingers, each of which includes a cross-shaped metal contact which provides an emitter contact for the device. The emitter contact comprises two perpendicular arms which intersect at a central area. An inter-level dielectric layer covers the emitter contact, and a via through this layer provides access to the contact. The via is square-shaped, centered over the center point of the central area, and oriented at a 45° angle to the arms.

Arranging the emitter contact and via in this way allows the via size to be equal to or greater than the minimum process dimension, while allowing the width of the emitter finger to be as narrow as possible with the alignment tolerances still being met. The resulting narrow emitter finger tends to improve device performance, and is particularly suitable for use with compound semiconductor-based devices, such as those built on indium phosphide (InP) or indium gallium arsenide (InGaAs) substrates.

Further features and advantages of the invention will be apparent to those skilled in the art from the following detailed description, taken together with the accompanying drawings.

BRIEF DESCRIPTION OF THE DRAWINGS

FIG. 2 is a plan view of an emitter contact and via per the present invention.

FIGS. 3–12 are isometric views which illustrate a set of process steps which could be used to fabricate a BJT device per the present invention.

DETAILED DESCRIPTION OF THE INVENTION

Figure 1A:
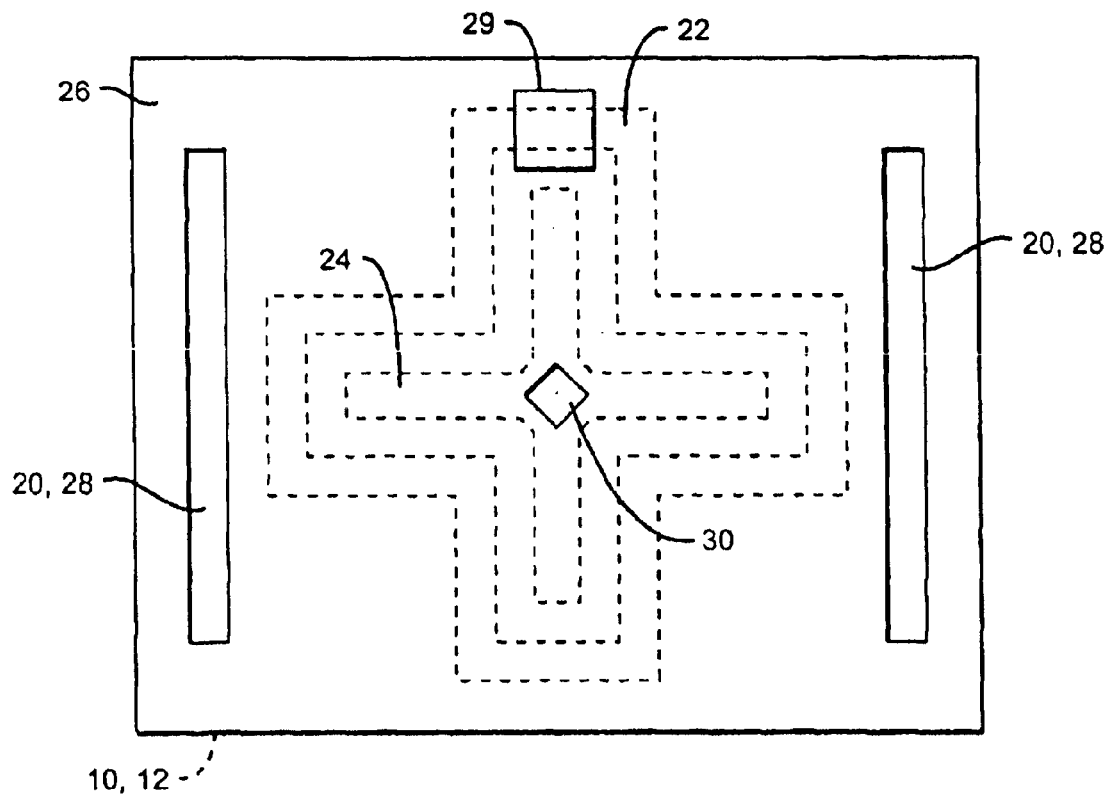
FIGS. 1a and 1b are plan and sectional views, respectively, of a BJT device per the present invention.
Figure 1B:
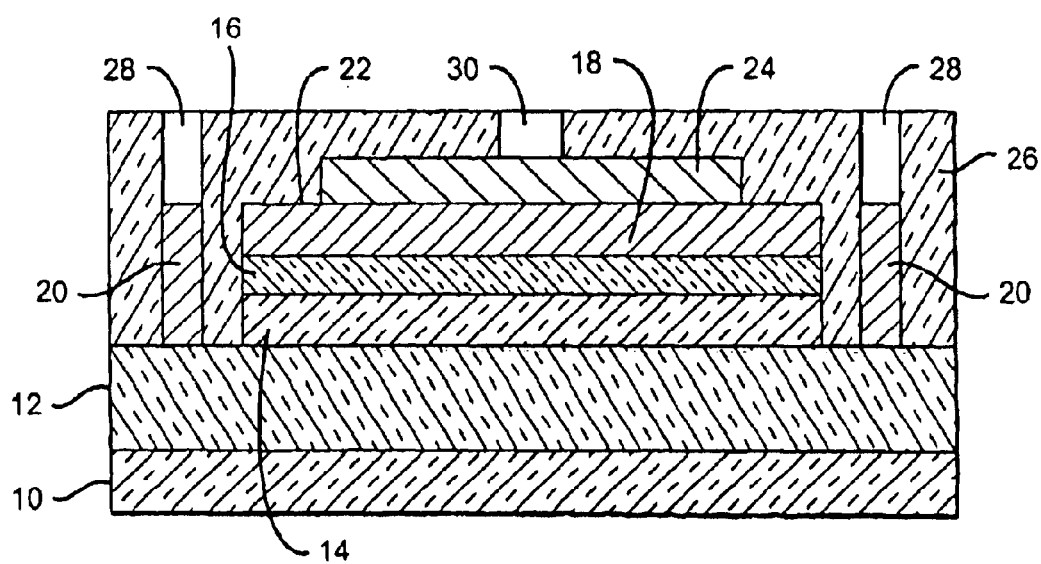

An exemplary embodiment of a BJT device with reduced emitter width is shown in FIGS. 1a (plan view) and 1b (corresponding sectional view). The BJT structure comprises a semi-insulating substrate 10, on top of which is formed a sub-collector 12. A collector 14 is on the sub-collector, a base 16 is atop the collector, and an emitter 18 is formed on the base. Metal contacts 20 are formed on sub-collector 12 to provide a collector terminal for the BJT, and a metal contact 22 on base 16 provides the device's base contact. A cross-shaped metal contact 24 on emitter 18 provides the device's emitter terminal.

An inter-level dielectric layer 26 covers the BJT structure, and vias are formed through layer 26 to access the device contacts: vias 28 provide access to collector contact 20, and a via 29 is formed to provide access to base contact 22. Another via 30 is formed through interlevel dielectric layer 26 to provide access to emitter contact 24. Emitter 18 and emitter contact 24 form an emitter "finger"; a typical power device includes a number of such fingers which are connected together using a metallization layer.

Emitter contact 24 and via 30 are shown in isolation in FIG. 2. Emitter contact 24 is cross-shaped, with two perpendicular arms 32 and 34, each of which is generally rectangular in shape, which intersect at a central area 36. Via 30 is square-shaped, centered over the center point 38 of central area 36, and oriented at a 45° angle to the arms. That is, the corners of the square-shaped via are aligned along the perpendicular axes 40 and 42 which run through the centers of arms 32 and 34, respectively.

This configuration allows via 30 to be as large as possible while the width of emitter contact arms 32 and 34 is as narrow as possible. Thus, if the minimum dimension for the process used to fabricate the device is 0.6 μm, and the alignment tolerance is 0.3 μm, the width of each of emitter contact arms 32 and 34 can be made equal to 0.6 μm. Then, because via 30 is oriented at a 45° angle to the arms, the via size can be 0.6 μm×0.6 μm or larger (0.71 μm×0.71 μm in this example) and still maintain the 0.3 μm alignment tolerance.

Note that the points 42 at which arms 32 and 34 intersect tend to be somewhat rounded or chamfered; this is a natural result of the etching process used to form them. This tends to increase the size of central area 36, as well as the margin of error available when forming via 30.

Making the arms of emitter contact 24 as narrow as possible reduces base resistance ($R_B$) and base-collector capacitance ($C_{BC}$), and thus improves RF performance. In addition, the contact's cross shape allows a uniform current distribution path, providing better heat spreading and hence higher device reliability.

In order to prevent the degradation of emitter resistance ($R_B$), the emitter metal composition and the length of arms 32 and 34 should be selected carefully. A maximum allowable voltage drop should first be determined. Then, select a metal composition having a particular thickness and resistance per unit length. With this data in hand, a maximum length for arms 32 and 34 which keeps the voltage drop less than or equal to the maximum allowable can be calculated.

The present BJT structure is particularly well-suited to transistors used in RF applications, the performance of which can be degraded by overly wide emitter fingers. Such devices are often fabricated on a compound semiconductor substrate, and are thus heterojunction bipolar transistors (HBTs). For an HBT device in accordance with the present invention, semi-insulating substrate 10 is preferably indium phosphide (InP). Sub-collector 12 is preferably InP or indium gallium arsenide (InGaAs), and collector 14 is preferably InP, InGaAs, indium aluminum arsenide (InAlAs), or indium aluminum arsenide phosphide (InAlAsP). The base layer 16 is preferably InGaAs or gallium arsenide antimonide (GaAsSb), and emitter 18 is preferably InP, InAlAs, or a layered structure comprising InP, InAlAs, and InGaAs. There may also be an emitter "cap" (not shown) over the emitter which reduces emitter contact resistance, that is preferably InP, InGaAs, or InAlAs.

A preferred process sequence which could be used to fabricate the present BJT device is shown in FIGS. 3–12, each of which depicts plan, front sectional, and side sectional isometric views. In FIG. 3, each of the starting material layers is deposited: a substrate layer 100, a sub-collector layer 102, a collector layer 104, a base layer 106, an emitter layer 108 and, optionally, an emitter cap layer 110.

Figure 4:
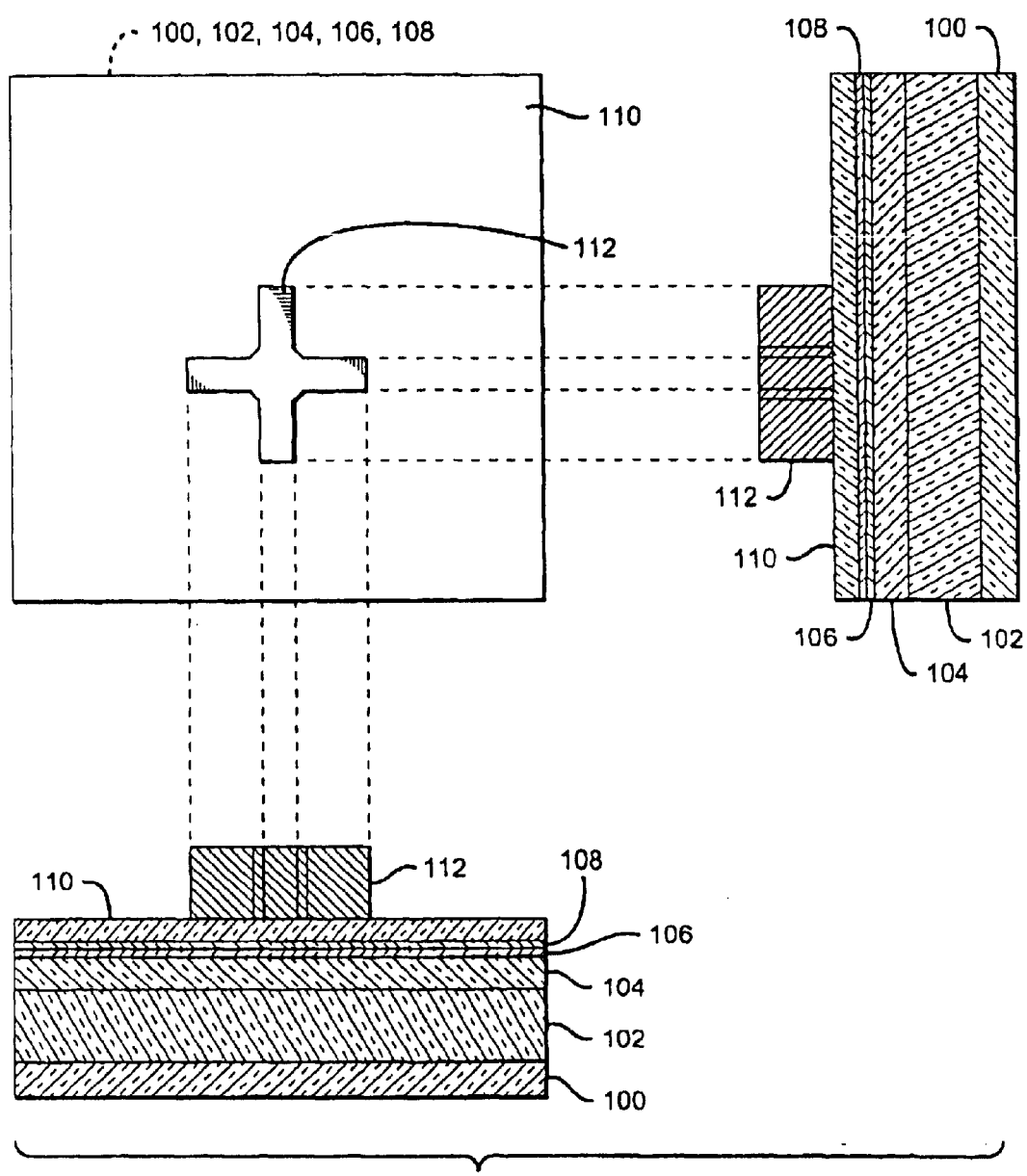
Figure 5:
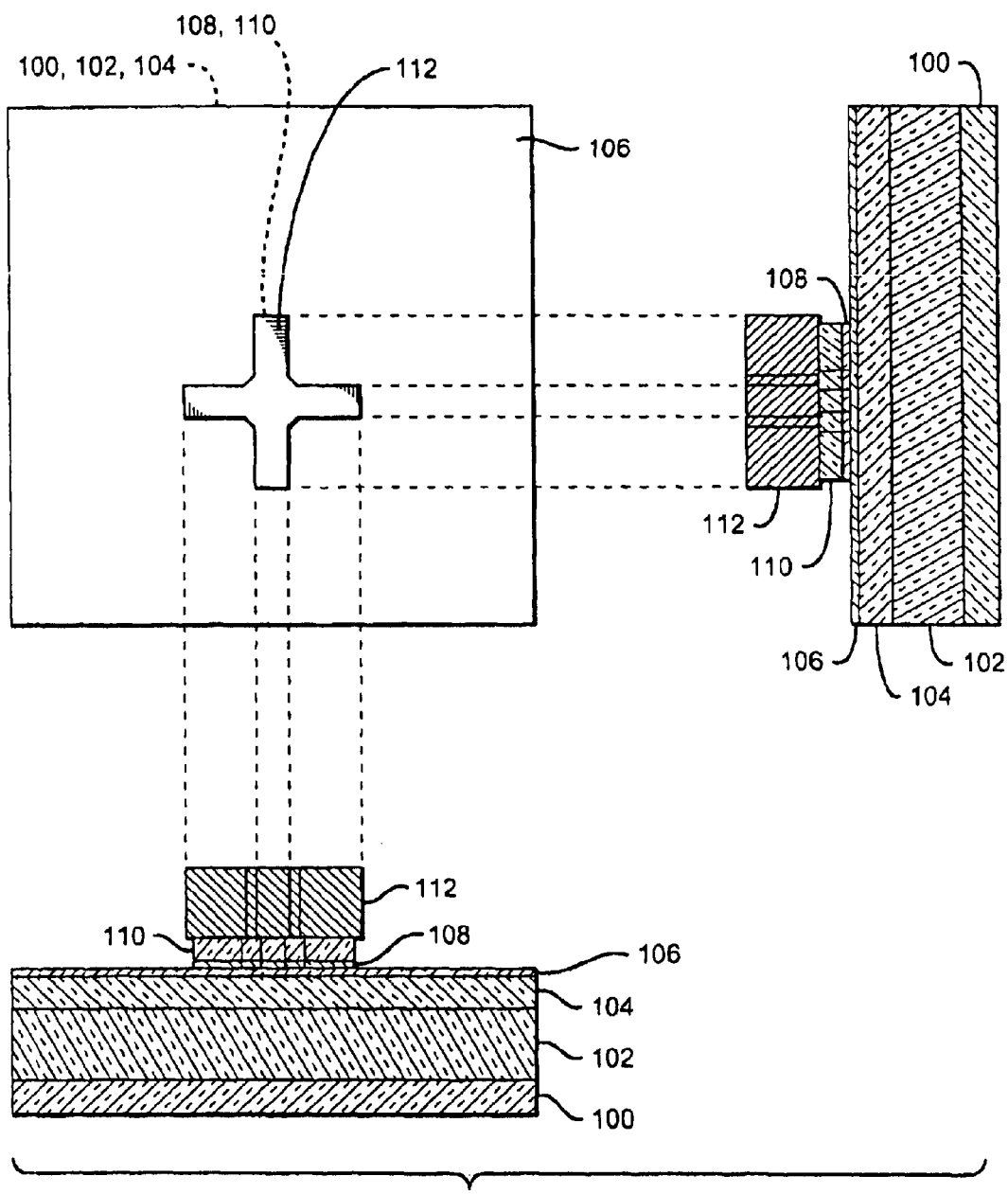

In FIG. 4, a metal layer has been deposited, patterned with photoresist, and etched to form a cross-shaped emitter contact 112 as described above, and in FIG. 5, emitter layer 108 and emitter cap layer 110 are patterned and etched into the same shape as emitter contact 112 to complete the fabrication of the emitter finger. Note that, alternatively, metal features can be fabricated by depositing and patterning photoresist, depositing a metal layer, and performing a "lift-off" step to form the desired feature.

Figure 6:
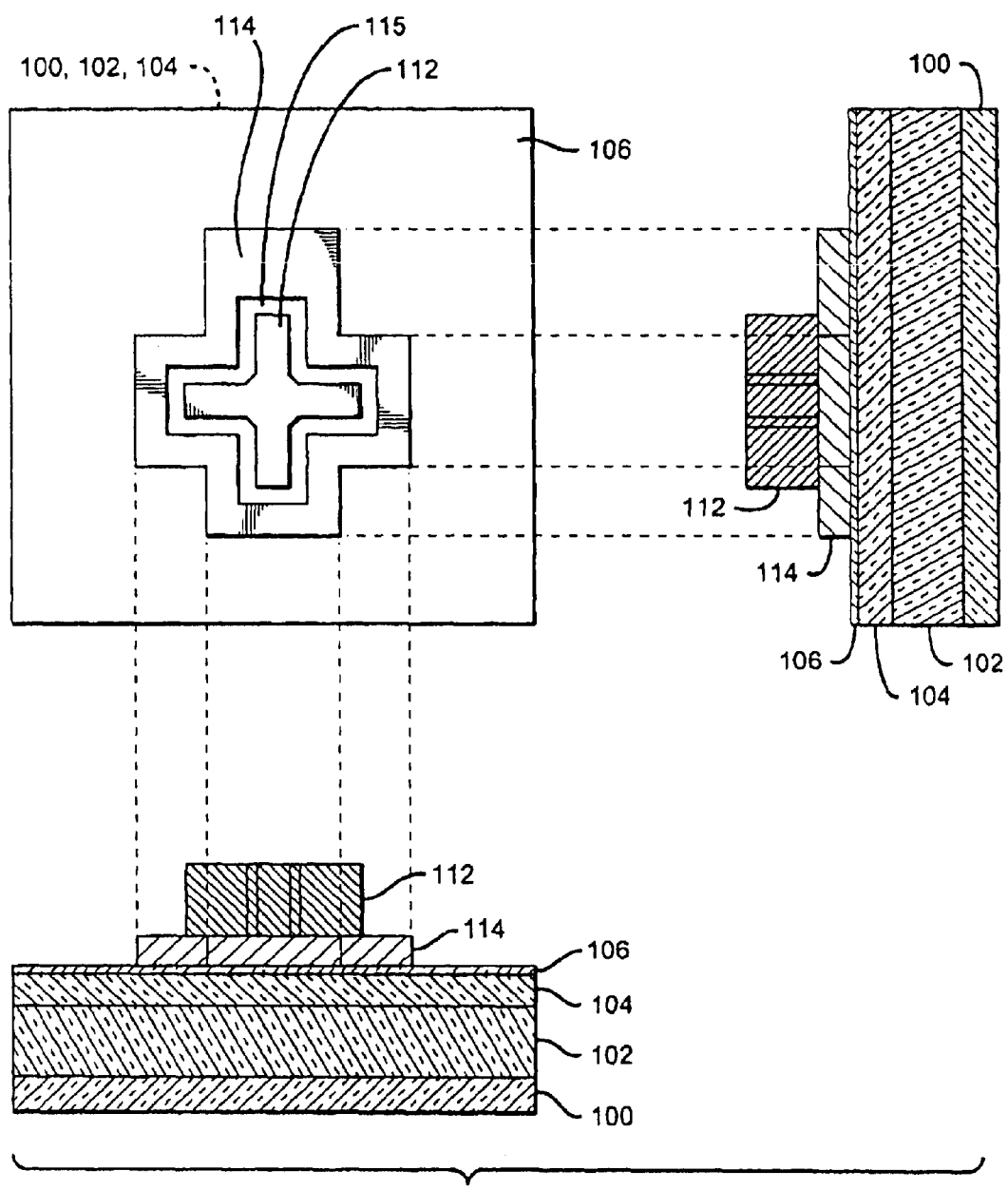

In FIG. 6, a metal layer has been deposited, patterned, and etched to form a base contact 114. Base contact 114 preferably surrounds emitter contact 112, with the base and emitter contacts physically and electrically separated by a gap 115.

Figure 7:
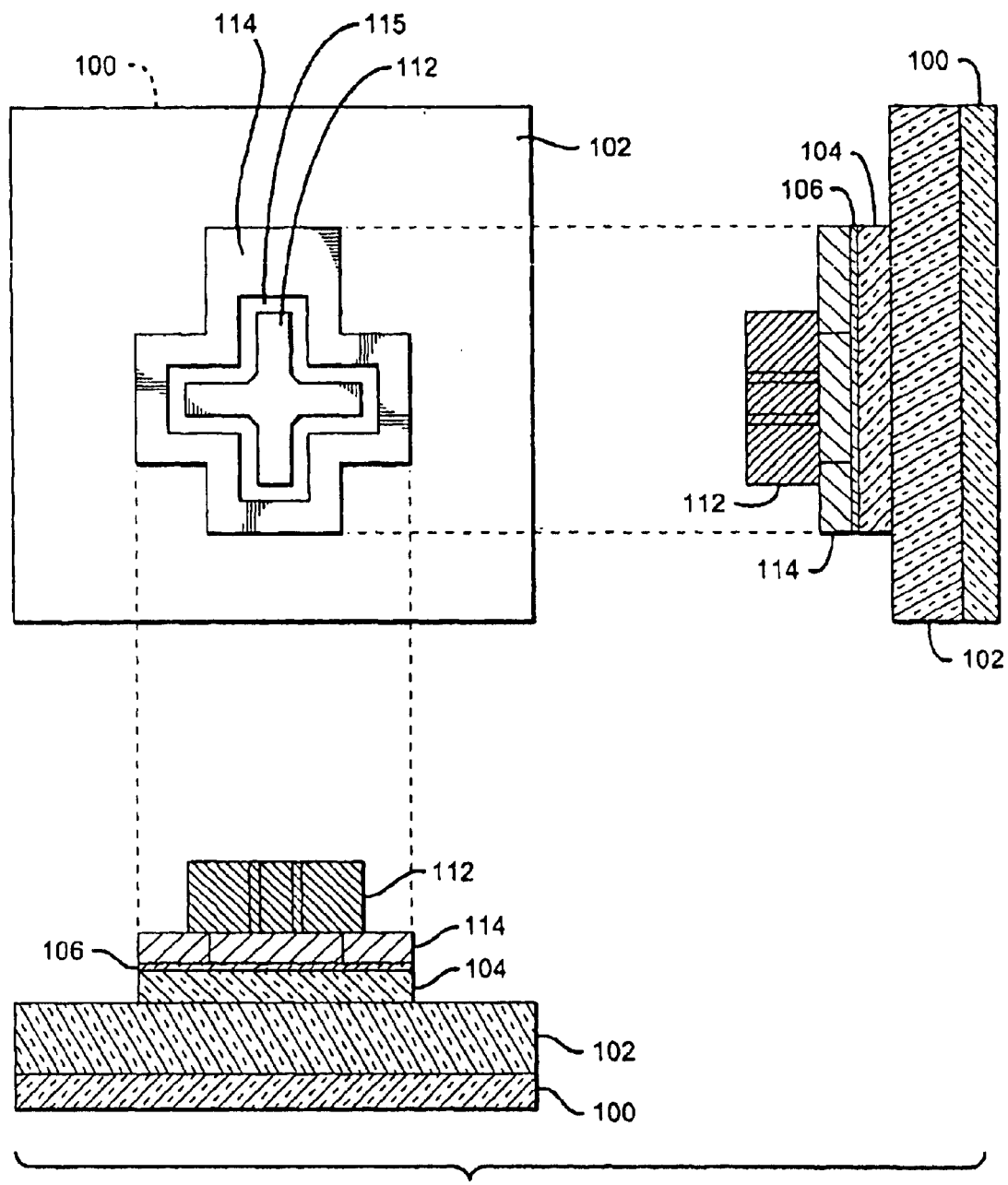

In FIG. 7, base layer 106 and collector layer 104 are patterned and etched to create a base pedestal and complete the fabrication of the device's base and collector.

Figure 8:
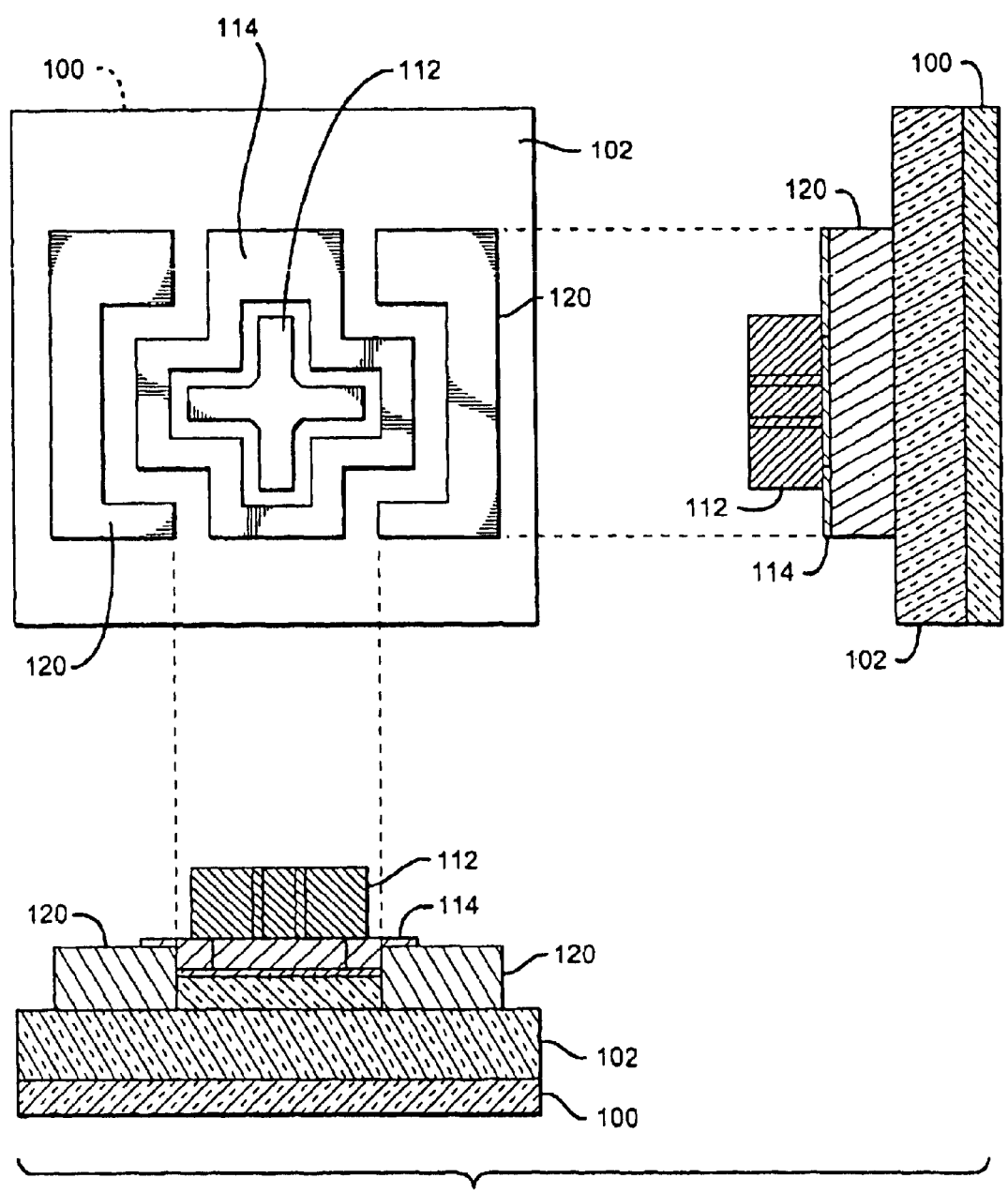
Figure 9:
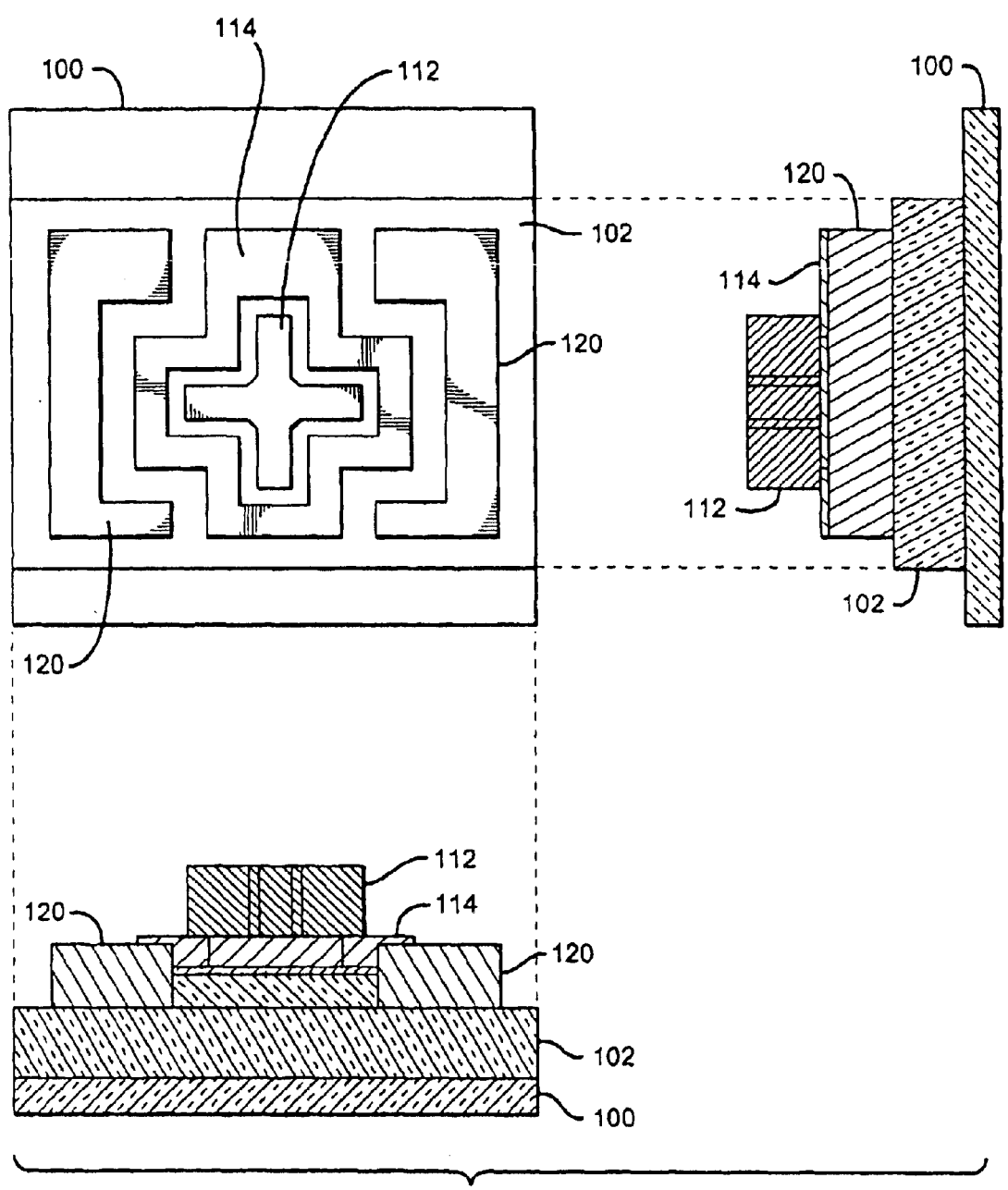

In FIG. 8, a metal layer is deposited, patterned, and etched to form collector contacts 120, and in FIG. 9, sub-collector layer 102 is patterned and etched to isolate the BJT device from other structures.

Figure 11:
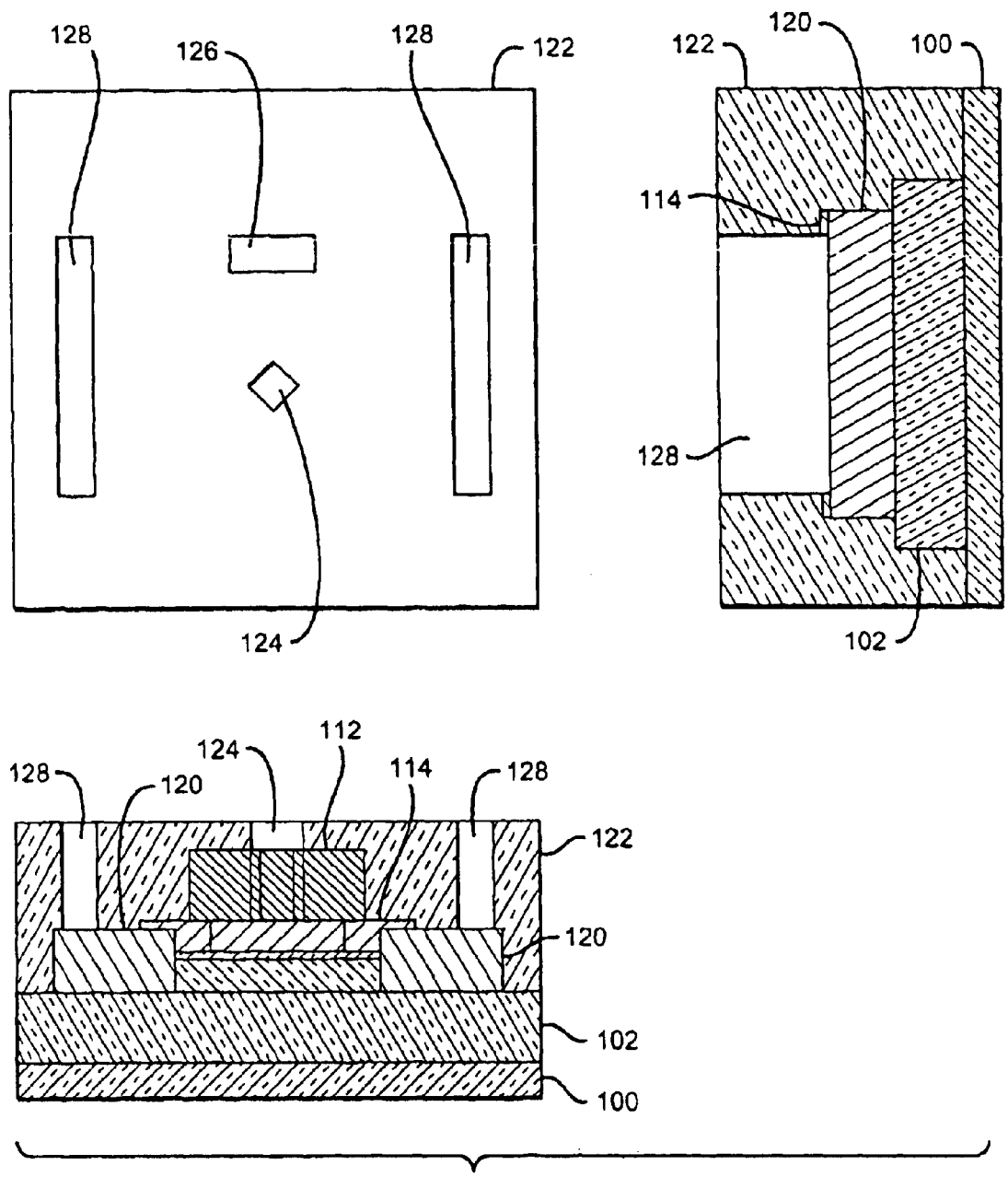
Figure 12:
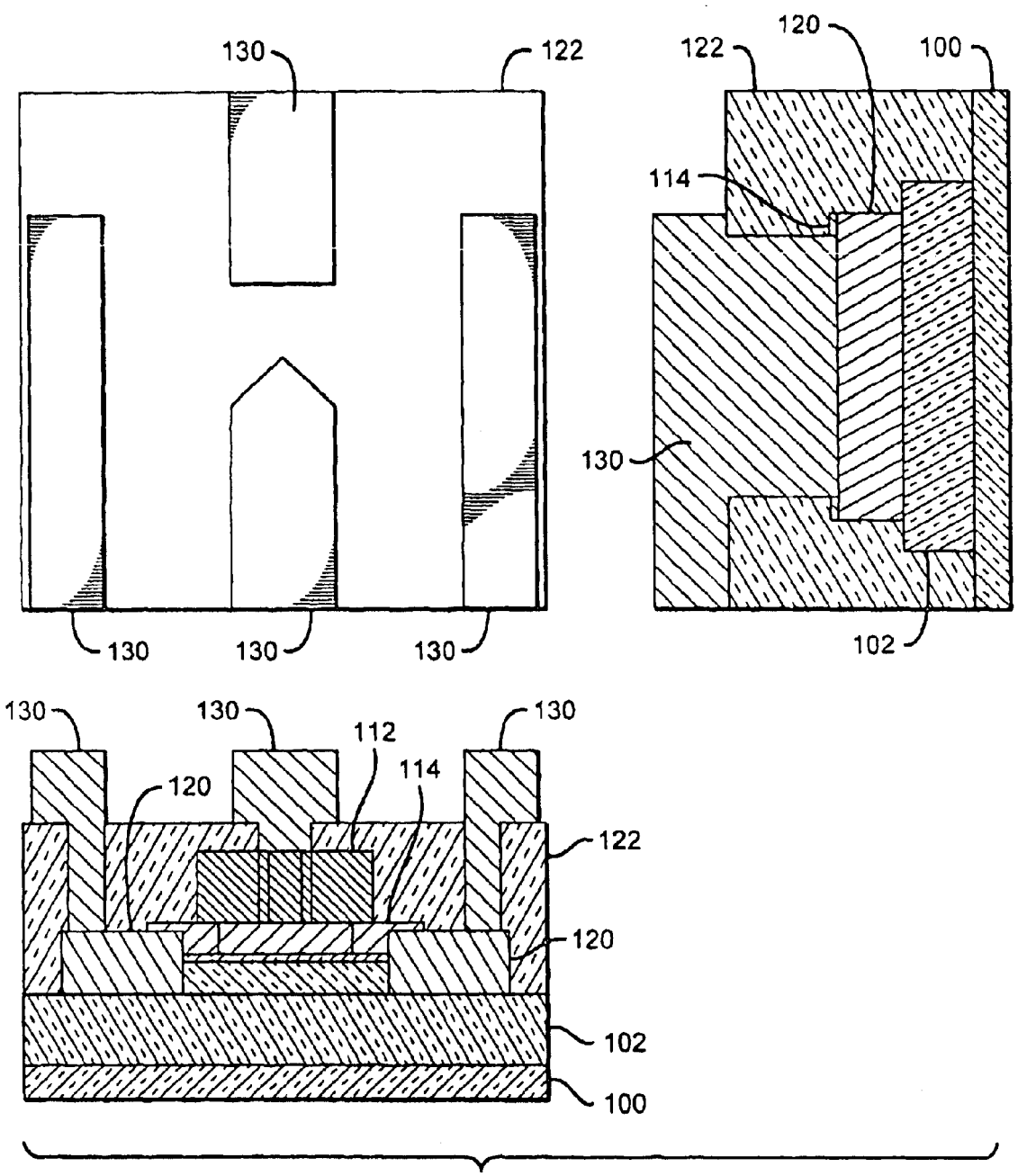

In FIG. 10, an inter-level dielectric layer 122 is deposited over the structure. In FIG. 11, an emitter via 124, a base via 126, and collector vias 128 are patterned and etched in dielectric layer 122 to provide access to the device's buried base, emitter and collector contacts. Emitter via 124 is as described above: square-shaped, centered over the center point of the central area of emitter contact 112, and oriented at a 45° angle to the arms of contact 112. This complete the fabrication of the present BJT device. In FIG. 12, a metal layer 130 is deposited, patterned and etched to provide metal interconnects to the device.

The process sequence depicted in FIGS. 3–12 shows only one method of fabricating a device in accordance with the present invention. Many other processes might be employed to produce the BJT structure.

While particular embodiments of the invention have been shown and described, numerous variations and alternate embodiments will occur to those skilled in the art. Accordingly, it is intended that the invention be limited only in terms of the appended claims.

We claim:

1. A bipolar junction transistor (BJT) fabricated with a process having a minimum process dimension of X μm and a minimum alignment tolerance, comprising:
   a semi-insulating substrate,
   a subcollector formed on said substrate,
   a collector formed on said subcollector,
   a first metal contact on said subcollector which provides a collector contact for said BJT,
   a base formed on said collector,
   an emitter formed on said base,
   a cross-shaped second metal contact on said emitter which provides an emitter contact for said BJT, said emitter contact comprising two perpendicular arms which intersect at a central area, the width of each of said arms being about equal to X μm;
   an inter-level dielectric layer on said emitter contact; and
   a via through said inter-level dielectric layer which provides access to said emitter contact, said via being square-shaped, centered over the center point of said central area, and oriented at a 45° angle to said arms such that said via can be sized as large as possible while maintaining said minimum alignment tolerance with respect to the boundaries of said emitter contact.

2. The BJT of claim 1, wherein said semi-insulating substrate comprises indium phosphide (InP).

3. The BJT of claim 1, wherein said semi-insulating substrate is a compound semiconductor.

4. The BJT of claim 1, wherein said arms are generally rectangular, have respective center points, are of approximately equal length, and intersect at their respective center points.

5. The BJT of claim 1, wherein said sub-collector comprises indium phosphide (InP) or indium gallium arsenide (InGaAs).

6. The BJT of claim 1, wherein said collector comprises indium phosphide (InP), indium gallium arsenide (InGaAs), indium aluminum arsenide (InAlAs), or indium aluminum arsenide phosphide (InAlAsP).

7. The BJT of claim 1, wherein said base comprises indium gallium arsenide (InGaAs).

8. The BJT of claim 1, wherein said base comprises gallium arsenide antimonide (GaAsSB).

9. The BJT of claim 1, wherein said emitter comprises indium phosphide (InP) or indium aluminum arsenide (InAlAs).

10. The BJT of claim 1, wherein said semi-insulating substrate is a compound semiconductor and said BJT structure is arranged to form a heterojunction bipolar transistor (HBT).

11. A heterojunction bipolar transistor (HBT) fabricated with a process having a minimum process dimension of X µm and a minimum alignment tolerance, comprising:
- a semi-insulating substrate comprising a compound semiconductor;
- a subcollector formed on said substrate;
- a collector formed on said subcollector;
- a first metal contact on said subcollector which provides a collector contact for said HBT;
- a base formed on said collector;
- an emitter formed on said base;
- a cross-shaped second metal contact on said emitter which provides an emitter contact for said BJT, said emitter contact comprising two perpendicular arms which intersect at a central area, the width of each of said arms being about equal to X µm;
- an inter-level dielectric layer on said emitter contact; and
- a via through said inter-level dielectric layer which provides access to said emitter contact, said via being square-shaped, centered over the center point of said central area, and oriented at a 45° angle to said arms, said square-shaped via sized as large as possible while maintaining said minimum alignment tolerance with respect to the boundaries of said emitter contact.

12. The HBT of claim 11, wherein said semi-insulating substrate comprises indium phosphide (InP).

13. The HBT of claim 11, wherein said arms are generally rectangular, have respective center points, are of approximately equal length, and intersect at their respective center points.

14. The HBT of claim 11, wherein said sub-collector comprises indium phosphide (InP) or indium gallium arsenide (InGaAs).

15. The HBT of claim 11, wherein said collector comprises indium phosphide (InP), indium gallium arsenide (InGaAs), indium aluminum arsenide (InAlAs), or indium aluminum arsenide phosphide (InAlAsP).

16. The HBT of claim 11, wherein said base comprises indium gallium arsenide (InGaAs).

17. The HBT of claim 11, wherein said base comprises gallium arsenide antimonide (GaAsSb).

18. The HBT of claim 11, wherein said emitter comprises indium phosphide (InP) or indium aluminum arsenide (InAlAs).

* * * * *